(12) United States Patent
Ho et al.

(10) Patent No.: US 9,992,858 B2
(45) Date of Patent: Jun. 5, 2018

(54) PRINTED CIRCUIT BOARD

(71) Applicants: FuKui Precision Component (Shenzhen) Co., Ltd., Shenzhen (CN); HongQiSheng Precision Electronics (QinHuangDao) Co., Ltd., Qinhuangdao (CN); GARUDA TECHNOLOGY CO., LTD, New Taipei (TW)

(72) Inventors: Ming-Jaan Ho, New Taipei (TW); Xian-Qin Hu, Guangdong (CN); Yi-Qiang Zhuang, Guangdong (CN); Fu-Wei Zhong, Guangdong (CN)

(73) Assignees: Avary Holding (Shenzhen) Co., Limited, Shenzhen (CN); HongQiSheng Precision Electronics (QinHuangDao) Co., Ltd., Qinhuangdao (CN); GARUDA TECHNOLOGY CO., LTD, New Taipei (TW)

( * ) Notice: Subject to any disclaimer, the term of this patent is extended or adjusted under 35 U.S.C. 154(b) by 0 days. days.

(21) Appl. No.: 15/604,798

(22) Filed: May 25, 2017

(65) Prior Publication Data

US 2017/0265295 A1    Sep. 14, 2017

Related U.S. Application Data

(62) Division of application No. 14/928,166, filed on Oct. 30, 2015, now Pat. No. 9,706,640.

(30) Foreign Application Priority Data

Dec. 23, 2014  (CN) .......................... 2014 1 0807510

(51) Int. Cl.
*H05K 1/11* (2006.01)
*H05K 1/02* (2006.01)
*H05K 3/46* (2006.01)

(52) U.S. Cl.
CPC ........... *H05K 1/024* (2013.01); *H05K 3/4697* (2013.01); *H05K 1/0221* (2013.01); *H05K 3/4623* (2013.01); *H05K 2203/061* (2013.01)

(58) Field of Classification Search
CPC ................. H05K 1/024; H05K 1/0253; H05K 2201/09072; H05K 2201/09036;
(Continued)

(56) References Cited

U.S. PATENT DOCUMENTS 4,614,922 A * 9/1986 Bauman .................. H01P 9/006
333/156
5,471,181 A * 11/1995 Park ........................ H01P 5/028
333/246
(Continued)

FOREIGN PATENT DOCUMENTS

TW    551626    9/2003
TW    I251981    3/2006

*Primary Examiner* — Chau N Nguyen
*Assistant Examiner* — Roshn Varghese
(74) *Attorney, Agent, or Firm* — ScienBiziP, P.C.

(57) ABSTRACT

A printed circuit board includes a first printed circuit substrate and a second printed circuit substrate. The first printed circuit substrate includes a substrate layer and a first conductive circuit layer. The first conductive circuit layer is formed on the substrate layer. The substrate layer includes at least two first grooves. The first conductive circuit layer includes at least one signal wire. The first grooves are defined in both sides of the signal wire. The second printed circuit substrate is formed on the first printed circuit substrate. The second circuit substrate includes a third copper layer. A second groove is defined in the third copper layer.

(Continued)

The first grooves are opposite to the second groove. The first grooves and the second groove form a space.

4 Claims, 13 Drawing Sheets

(58) Field of Classification Search
CPC .......... H05K 2201/09736; H05K 2201/09745; H05K 2201/09681; H05K 2201/09718; H01P 3/084
See application file for complete search history.

(56) References Cited

U.S. PATENT DOCUMENTS

| | | | | |
|---|---|---|---|---|
| 5,712,607 | A * | 1/1998 | Dittmer | H01P 3/087 333/238 |
| 6,535,088 | B1 * | 3/2003 | Sherman | H01P 3/087 333/238 |
| 7,755,445 | B2 * | 7/2010 | Dutta | H01P 3/084 333/1 |
| 7,999,638 | B2 * | 8/2011 | Niman | H01P 1/203 333/238 |
| 9,084,342 | B2 * | 7/2015 | Chang | H05K 3/0035 |
| 2004/0048420 | A1 * | 3/2004 | Miller | H01P 3/084 438/127 |

* cited by examiner

PRINTED CIRCUIT BOARD

CROSS-REFERENCE TO RELATED APPLICATIONS

This is a divisional application of patent application Ser. No. 14/928,166, filed on Oct. 30, 2015, entitled "METHOD FOR MANUFACTURING PRINTED CIRCUIT BOARD", assigned to the same assignee, which is based on and claims priority to Chinese Patent Application No. 201410807510.X filed on Dec. 23, 2014, the contents of which are incorporated by reference herein.

FIELD

The subject matter herein generally relates to printed circuit board (PCB) technology, particularly to a PCB and a method for manufacturing same.

BACKGROUND

Signal wire attenuation in high-frequency transmission is mainly formed by dielectric loss. The dielectric loss is proportional to dielectric loss factor and relative dielectric constant. Generally, printed circuit board (PCB) uses materials with lower relative dielectric constant, such as liquid crystal polymer (LCP), Teflon, pure glue and so on, to reduce dielectric loss.

BRIEF DESCRIPTION OF THE DRAWINGS

Implementations of the present technology will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure. The description is not to be considered as limiting the scope of the embodiments described herein.

Several definitions that apply throughout this disclosure will now be presented.

The term "comprising" means "including, but not necessarily limited to"; it specifically indicates open-ended inclusion or membership in a so-described combination, group, series, and the like. The term "a plurality of" and "a number of", when utilized, mean "the amount of the object is at least two".

The present disclosure is described in relation to a printed circuit board and a method for manufacturing same.

Figure 1:
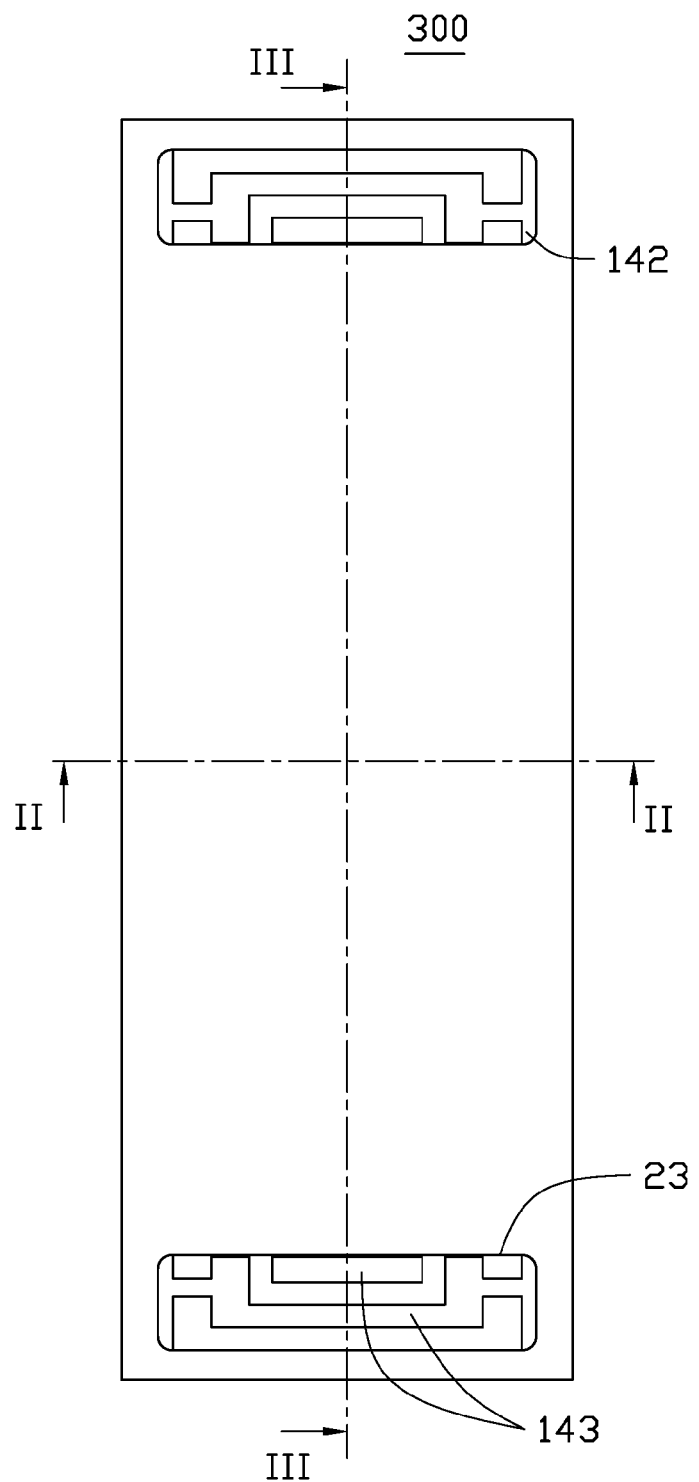
FIG. 1 is a plan view of a printed circuit board.
Figure 2:
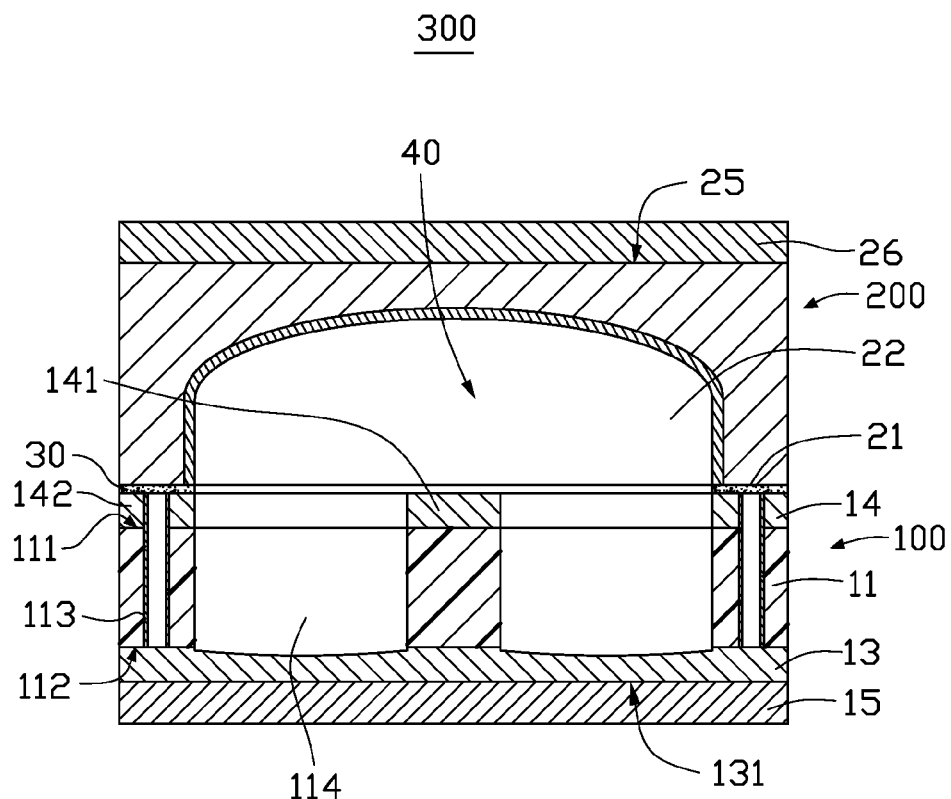
FIG. 2 is a cross-sectional view along a line II-II in FIG. 1.
Figure 3:
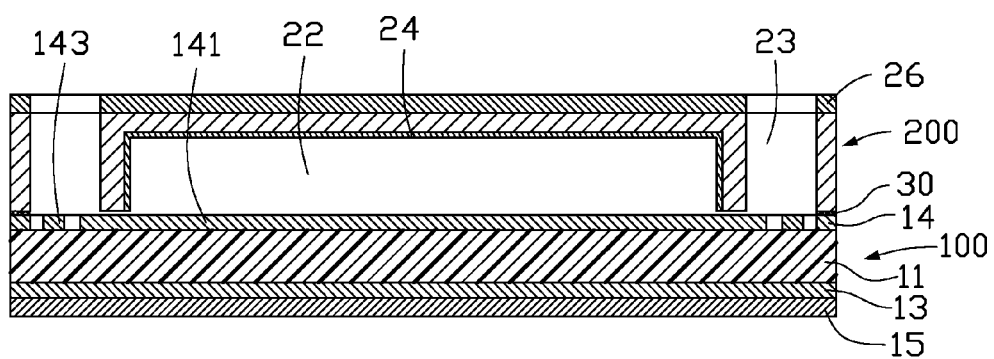
FIG. 3 is a cross-sectional view along a line in FIG. 1.

FIGS. 1-3 illustrate a printed circuit board 300. The printed circuit board 300 includes a first printed circuit substrate 100, a second printed circuit substrate 200, a first solder layer 15 and a second solder layer 26.

The first printed circuit substrate 100 includes a substrate layer 11, a first conductive circuit layer 12, and a second copper layer 13. The substrate layer 11 includes a first surface 111 and a second surface 112 opposite to the first surface 111. The first conductive circuit layer 12 is coupled on the first surface 111. The second copper layer 13 is coupled on the second surface 112. The first conductive circuit layer 12 includes one signal wire 141, two ground wires 142, and two contact pads 143. The ground wires 142 are respectively arranged on two opposite sides of the signal wire 141. The ground wires 142 are separate from the signal wire 141. The contact pads 143 are near to two opposite ends of the first printed circuit substrate 100. The contact pads 143 are respectively electrically connected to the signal wire 141 and the ground wires 142.

A plurality of conductive holes 113 and two first grooves 114 are defined in the substrate layer 11. The conductive holes 113 are distributed along the ground wires 142 equally. The conductive holes 113 are electrically connected to the ground wires 142 and the second copper layer 13.

The two first grooves 114 are opened from the first surface 111 to the inner of the substrate layer 11. The two first grooves 114 passes through the substrate layer 11.

In at least one exemplary embodiment, a portion of the second copper layer 13 is also etched, thereby, the first grooves 114 are slightly sunken into the second copper layer 13.

In at least one exemplary embodiment, each of the two first grooves 114 is cuboid-shaped. The length of each first groove 114 is approximately equal to the length of the signal wire 141. An extension direction of each first groove 114 is approximately the same as an extension direction of the signal wire 141. Two inside walls along the extension direction of the first grooves 114 are respectively coplanar to the side surface of the signal wire 141 and the side surface of the ground wire 142.

In at least one exemplary embodiment, two inside walls along the extension direction of the first grooves 114 are not respectively coplanar to the side surface of the signal wire 141 and the side surface of the ground wire 142.

The second printed circuit substrate 200 is adhered on the first printed circuit substrate 100 by an adhesive layer 30.

The second printed circuit substrate 200 includes a third copper layer 20 and an insulating layer 24.

The third copper layer 20 includes a fourth surface 21. The thickness of the third copper layer 20 is greater than the thickness of the first copper layer 12 and the thickness of the second copper layer 13.

A second groove 22 and two through holes 23 are defined in the third copper layer 20.

The second groove 22 is defined from the fourth surface 21 to the inner of the second printed circuit substrate 20. The second groove 22 is a rectangle-shaped. The section of the second groove 22 perpendicular to the extension direction is U-shaped. The distance of the side wall of the U-shaped section is less than or equal to the distance of the ground lines 142. The through holes 23 are defined on two ends of the second printed circuit substrate 200 and lay in the extension direction of the second groove 22, respectively. The through holes 23 are set a certain distance from the second groove 22.

A space 40 is defined by the second groove 22 and the first grooves 114. The signal wire 141 is surrounded by air in the space 40. The second copper layer 13, the conductive holes 113, the conductive adhesive layer 30, and the third copper layer 20 form a shielding structure. The shielding structure surrounds the signal wire 141 and is used to shield electromagnetism from the outside in case the signal wire 141 is disturbed.

The first solder layer 15 and the second solder layer 26 are respectively attached on two opposite surfaces of the printed circuit board 300.

TABLE 1

| materials | relative dielectric constant | dielectric loss factor |
| --- | --- | --- |
| air | 1 | →0 |
| polyimide | 3.5 | 0.003 |
| polyethylene naphthalate | 2.9 | 0.004 |
| Teflon | 2.1 | 0.0027 |
| liquid crystal polymer | 3.2 | 0.0026 |
| polyethylene terephthalate | 3.2 | 0.005 |

Table 1 is a dielectric loss correlation form of various materials.

In at least one exemplary embodiment, the amount of the signal wire 141 can be a positive integer which is greater than one, the amount of the ground wire 142 can be $2^n$, wherein, n is a positive integer.

Figure 4:
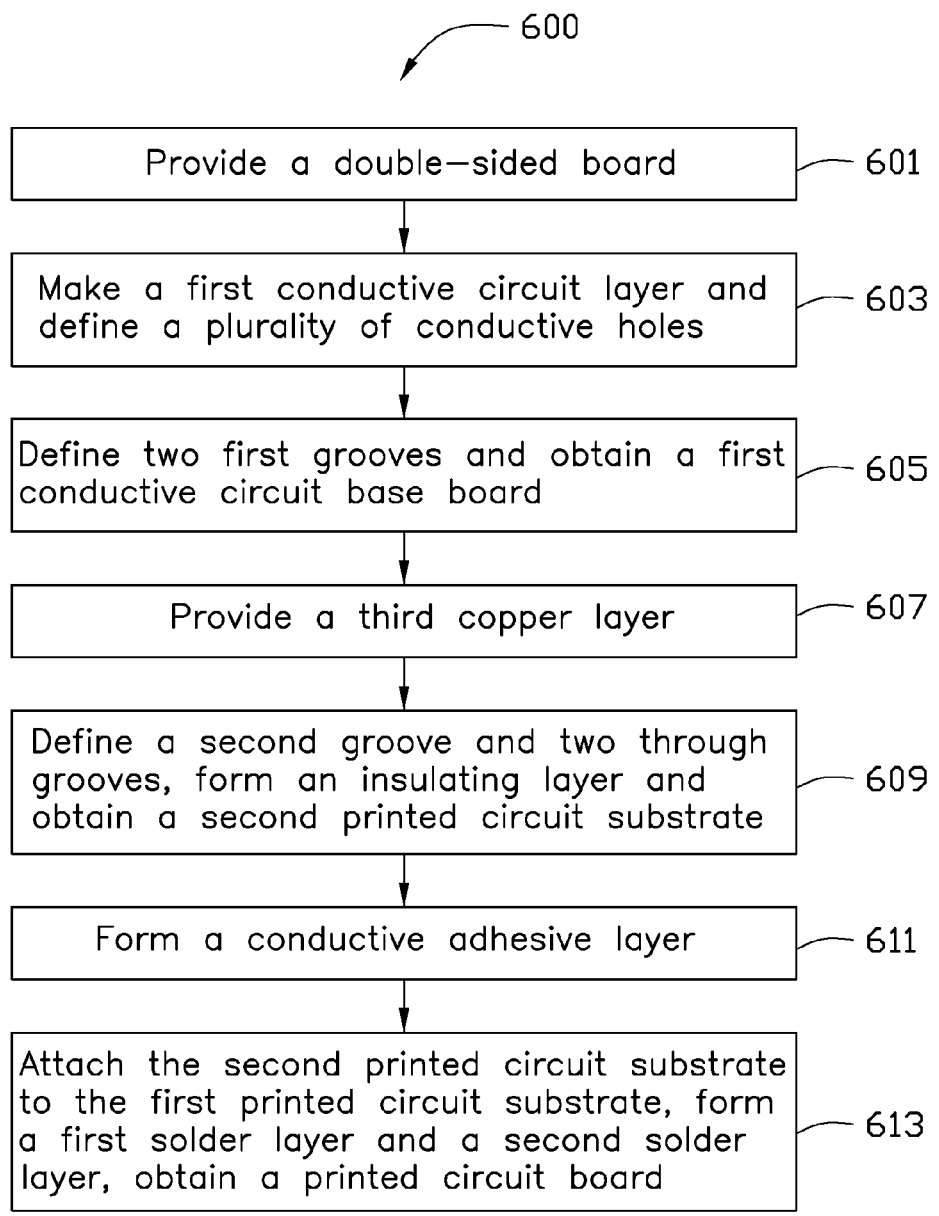
FIG. 4 is a flowchart of a method for manufacturing a printed circuit board in accordance with an embodiment of the present disclosure.

FIG. 4 illustrates a flowchart of a method for manufacturing a printed circuit board. The method is provided by way of example, as there are a variety of ways to carry out the method. The method described below can be carried out using the configurations illustrated in FIGS. 1-3, 5-13, for example, and various elements of these figures are referenced in explaining example method. Each block shown in FIGS. 1-3, 5-13 represents one or more processes, methods, or subroutines, carried out in the exemplary method. Furthermore, the illustrated order of blocks is by example only and the order of the blocks can change. Additional blocks may be added or fewer blocks may be utilized, without departing from this disclosure. The exemplary method 600 can begin at block 601.

Figure 5:
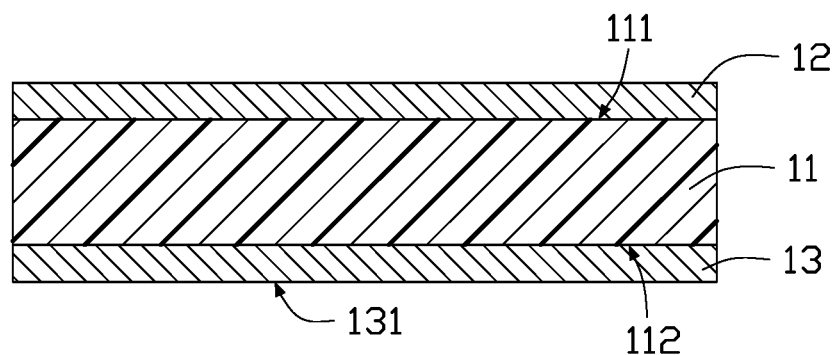
FIG. 5 is a cross-sectional view of a double-sided board.

At block 601, also illustrated by FIG. 5, a double-sided board 10 is provided.

The double-sided board 10 includes a substrate layer 11, a first copper layer 12, and a second copper layer 13.

The substrate layer 11 includes a first surface 111 and a second surface 112 opposite to the first surface 111. The first copper layer 12 is formed on the first surface 111, the second copper layer 13 is formed on the second surface 112. The second copper layer 13 includes a third surface 131 far away from the second surface 112.

The substrate layer 11 can be made of polyimide (PI), polyethylene terephthalate (PET), polyethylene naphthalate (PEN), polyethylene (PE), Teflon, liquid crystal polymer (LCP) or polyvinyl chloride polymer (PVC).

Figure 6:
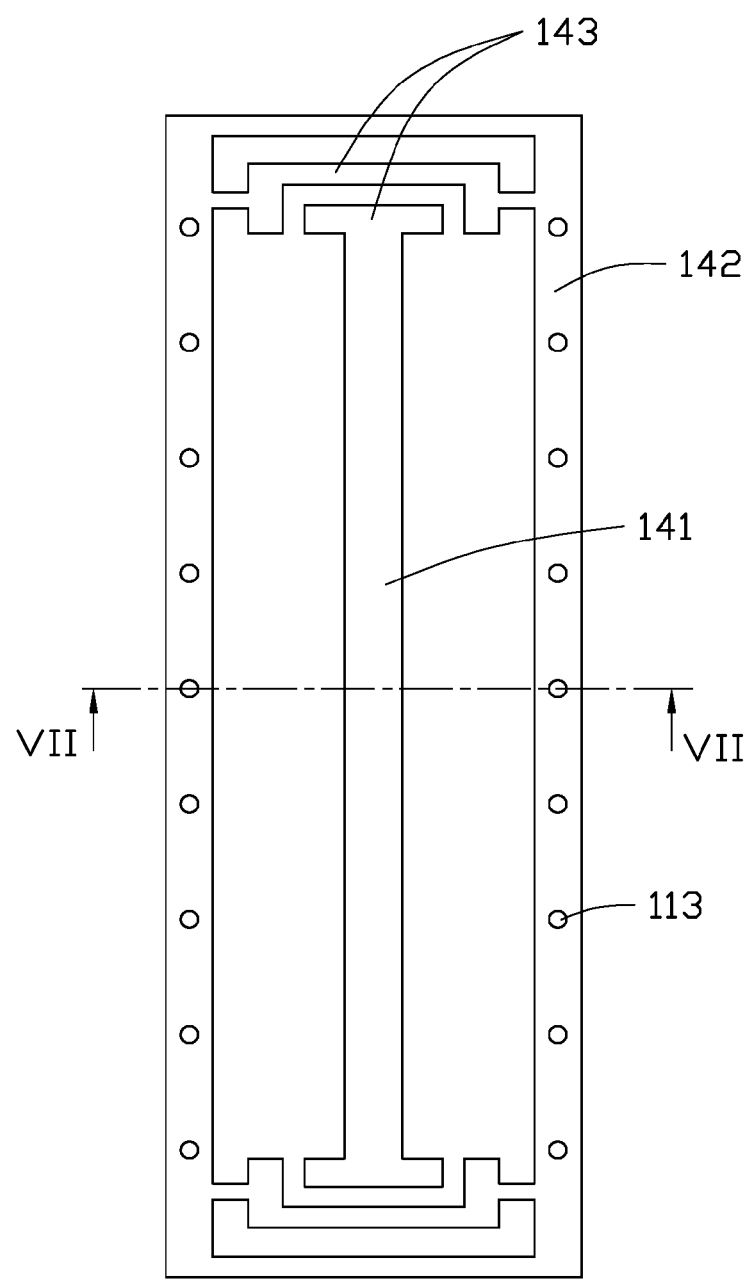
FIG. 6 illustrates that conductive circuit layers are formed by etching copper foils of double-sided board in FIG. 1 in a plan view.
Figure 7:
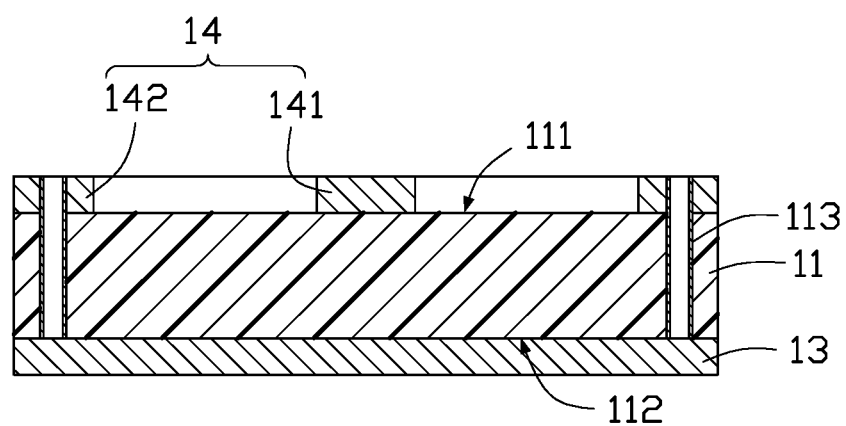
FIG. 7 is a cross-sectional view along a VII-VII wire in FIG. 6.

At block 603, also illustrated by FIG. 6, a first conductive circuit layer 14 is made of the first copper layer 12 and a plurality of conductive holes 113 are defined in the double-sided board 10

In at least one exemplary embodiment, the first conductive circuit layer 14 is formed by selective etching. The first conductive circuit layer 14 includes one signal wire 141, two ground wires 142 and two contact pads 143. The ground wires 142 are respectively arranged on two opposite sides of the signal wire 141. The ground wires 142 are separate from the signal wire 141. The contact pads 143 are near to two opposite ends of the double-sided board 10. The contact pads 143 are respectively electrically connected to the signal wire 141 and the ground wires 142. The conductive holes 113 are distributed along the ground wires 142 equably. At block 603, also illustrated by FIG. 7, the conductive holes 113 are electrically connected the ground wires 142 and the second copper layer 13.

In at least one exemplary embodiment, the conductive holes 113 can be obtained in following ways. A number of through holes 1131 are defined in the double-sided board 10. The through holes 1131 can be formed by laser or machine drilling process. An electro-copper layer 1132 is formed on the walls of the through holes 1131 by electroplating.

Figure 8:
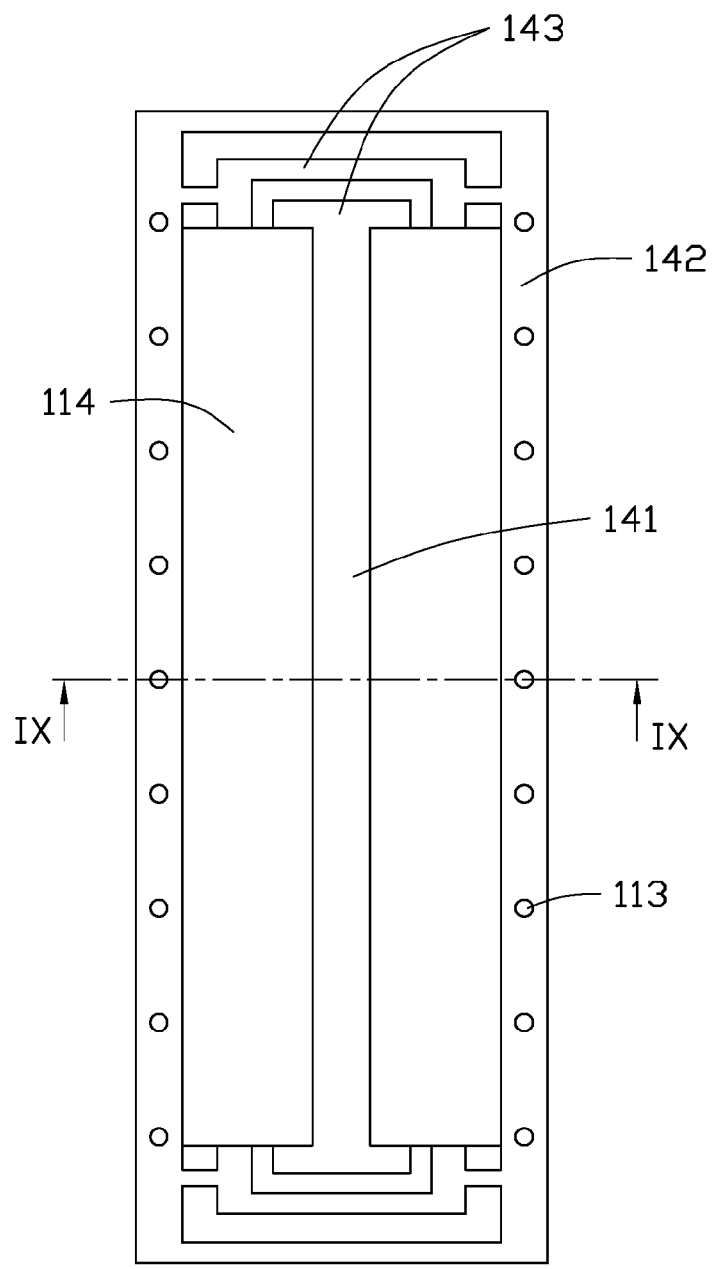
FIG. 8 illustrates that at least two first grooves are defined by etching the substrate layer in FIG. 7 in a plan view.

At block 605, also illustrated by FIG. 8, two first grooves 114 are defined from the first surface 111 to the inner of the substrate layer 11, thereby, a first conductive circuit base board 100 is obtained.

Figure 9:
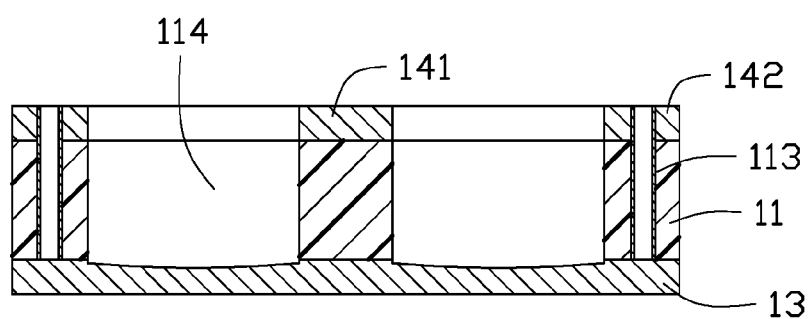
FIG. 9 is a cross-sectional view along a line IX-IX in FIG. 8.

At block 605, also illustrated by FIG. 9, the first grooves 114 pass through the substrate layer 11.

The first grooves 114 are defined by chemical etching or laser ablating. In the illustrated embodiment, a portion of the second copper layer 13 is also be etched, thereby, the first grooves 114 are slightly sunken into the second copper layer 13.

In at least one exemplary embodiment, each of the two first grooves 114 is cuboid-shaped. The length of each first groove 114 is approximately equal to the length of the signal wire 141. Each first groove 114 extends in approximately a same direction as the signal wire 141. Two inside walls along the extension direction of the first grooves 114 are respectively coplanar to the side surface of the signal wire 141 and the side surface of the ground wire 142.

In at least one exemplary embodiment, two inside walls along the extension direction of the first grooves 114 are not respectively coplanar to the side surface of the signal wire 141 and the side surface of the ground wire 142.

Figure 10:
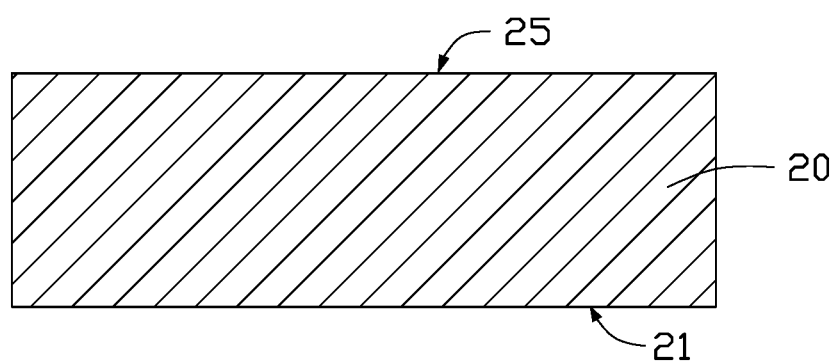
FIG. 10 is a cross-sectional view of a one-sided board.

At block 607, also illustrated by FIG. 10, a third copper layer 20 is provided. The third copper layer 20 includes a fourth surface 21 and a fifth surface 25 opposite to the fourth surface 21. The thickness of the third copper layer 20 is greater than the thickness of the first copper layer 12 and the thickness of the second copper layer 13.

Figure 11:
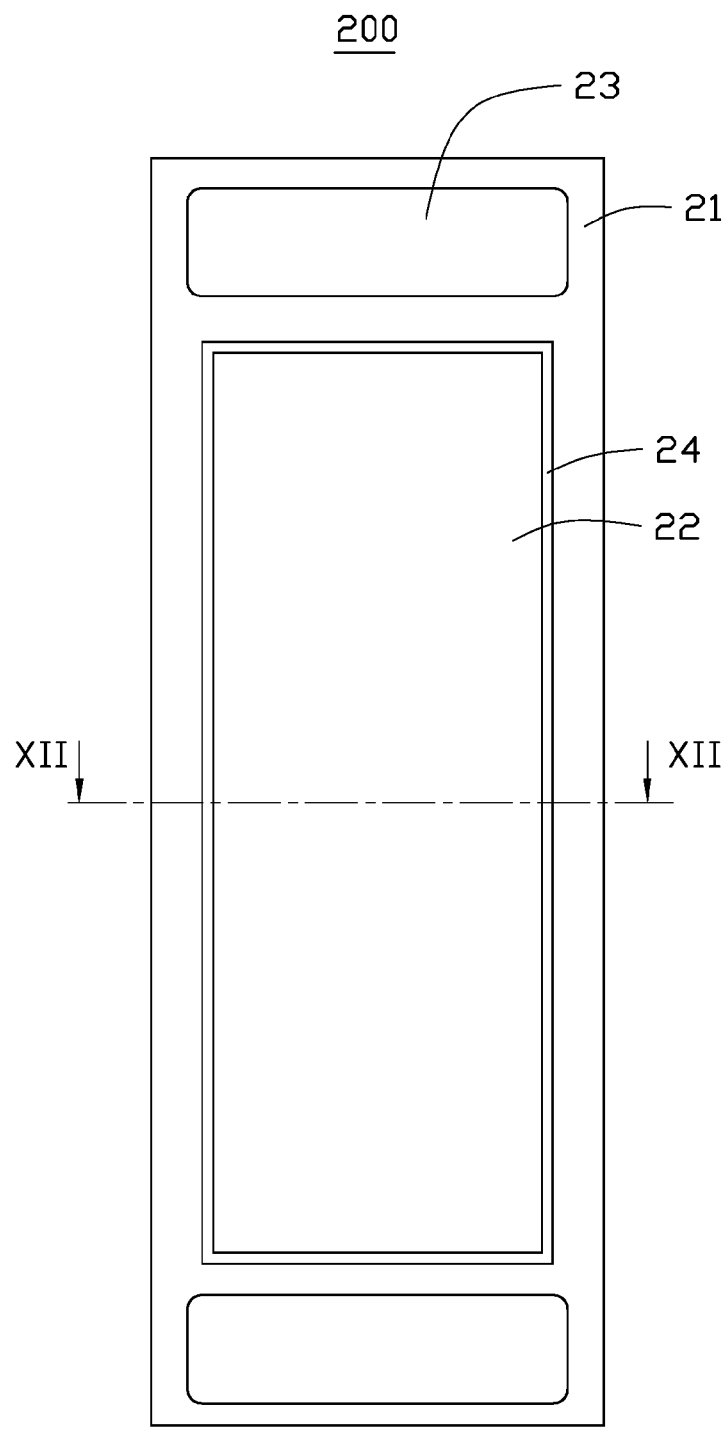
FIG. 11 is a plan view of the one-sided board in FIG. 10, and the one-sided board is ready-made.

At block 609, also illustrated by FIG. 11, a second groove 22 and two through holes 23 are defined in the third copper layer 20. An insulating layer 24 is formed on the inner surface of the second groove 22. The second groove 22 is defined from the fourth surface 21 to the inner of the second printed circuit substrate 20. The through holes 23 are respectively defined on two ends of the second printed circuit substrate 200 and lay in the extension direction of the second groove 22. The through holes 23 are set a certain distance from the second groove 22.

Figure 12:
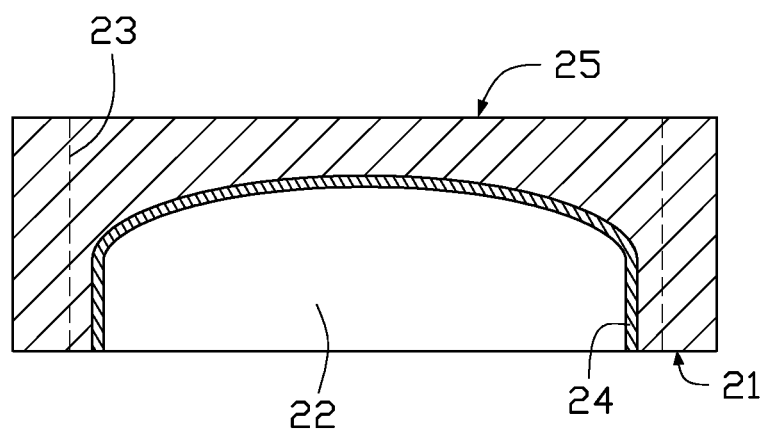
FIG. 12 is cross-sectional view along a VIII-VIII wire in FIG. 11.

At block 609, also illustrated by FIG. 12, the second groove 22 is a rectangle-shaped. The section of the second groove 22 perpendicular to its extension direction is U-shaped. The distance of the side wall of the U-shaped section is less than or equal to the distance of the ground lines 142.

In at least one exemplary embodiment, the second groove 22 and the through holes 23 are defined by a laser or chemical etching process. The insulating layer 24 is formed by a spraying process.

Figure 13:
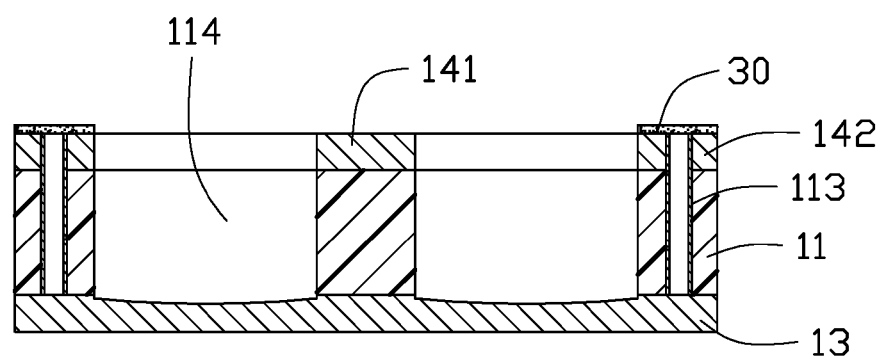
FIG. 13 illustrates that conductive bonding layers are formed on the surfaces of the double-sided board in FIG. 9 in the cross-sectional view.

At block 611, also illustrated by FIG. 13, a conductive adhesive layer 30 is formed on the ground lines 142. In the illustrated embodiment, the shape of the conductive adhesive layer 30 is the same as the shape of the ground lines 142.

The conductive adhesive layer 30 can be formed by a printing, attaching or depositing process. The conductive adhesive layer 30 can be pressure sensitive adhesive (PSA), thermosetting type conductive adhesive, conductive silver paste, conductive silver paste and so on.

At block 613, also illustrated by FIG. 2 the second printed circuit substrate 20 is attached to the first printed circuit substrate 100. A first solder layer 15 is formed on the third surface 13. A second solder layer 26 is formed on the fifth surface 25. Thereby, a printed circuit board 300 is obtained.

At block 613, also illustrated by FIG. 3, the conductive adhesive layer 30 is adhered between the ground wires 142 and the second printed circuit substrate 200. The conductive adhesive layer 30 is electrically connected to the ground wires 142 and the second printed circuit substrate 20.

At block 613, also illustrated by FIG. 1, a number of contact pads 143 are exposed in the through holes 23.

A space 40 is defined by the second groove 22 and the first grooves 114. The signal wire 141 is surrounded by air in the space 40. The second copper layer 13, the conductive holes 113, the conductive adhesive layer 30, and the third copper layer 20 form a shielding structure. The shielding structure surrounds the signal wire 141 and is configured to shield electromagnetism from the outside in case the signal wire 141 is disturbed.

In at least one exemplary embodiment, the method for manufacturing the printed circuit board 300 also includes: components are welded on the contact pads 123, under-filler is formed on bottom of the components, as a result, an enclosed space is defined in the space 40.

The embodiments shown and described above are only examples. Many details are often found in the art such as the other features of the lead frame and light emitting diode package having the same. Therefore, many such details are neither shown nor described. Even though numerous characteristics and advantages of the present technology have been set forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims. It will therefore be appreciated that the embodiments described above can be modified within the scope of the claims.

What is claimed is:

1. A printed circuit board, comprising:
   a first printed circuit substrate, the first printed circuit substrate comprising a substrate layer and a first conductive circuit layer, the first conductive circuit layer being defined on the substrate layer, the substrate layer comprising first grooves, the first conductive circuit layer including at least one signal wire, at least one of the first grooves being defined in one side of the at least one signal wire, wherein the first printed circuit substrate further comprises a second copper layer, the first conductive circuit layer further comprising at least two ground wires, the at least two ground wires being arranged on opposite sides of the signal wire, the at least two ground wires being separate from the signal wire; wherein the substrate layer comprises conductive holes, the conductive holes being equally distributed along the at least two ground wires and electrically connecting the at least two ground wires to the second copper layer; and
   a second printed circuit substrate, the second printed circuit substrate being defined on the first printed circuit substrate, the second circuit substrate comprising a third copper layer, a second groove being opened in the third copper layer, the first groove being opposite to the second groove, the first groove and the second groove forming a space, the signal wire being surrounded by air in the space, wherein the second printed circuit substrate is coupled to the first printed circuit substrate by a conductive adhesive layer, the second copper layer, and the conductive holes; the conductive adhesive layer and the third copper layer forming a shielding structure, the shielding structure surrounding the signal wire.

2. The printed circuit board of claim 1, further comprising a first solder layer and a second solder layer, wherein the first solder layer and a second solder layer are defined on two opposite surfaces of the first printed circuit substrate, respectively.

3. The printed circuit board of claim 1, wherein the first conductive circuit layer also comprises contact pads, the contact pads being near to two opposite ends of the first printed circuit substrate, the contact pads being electrically connected to the signal wire and the ground wires respectively.

4. The printed circuit board of claim 1, wherein, the first grooves pass through the substrate layer, the length of each of the first grooves is approximately equal to the length of the signal wire, an extension direction of each of the first grooves is approximately same to an extension direction of the signal wire, and two inside walls along the extension direction of the first grooves are respectively coplanar to a side surface of the signal wire and a side surface of the ground wire.

* * * * *